Aug. 26, 1969 G. WINSTEL ET AL 3,463,681

COATED MESA TRANSISTOR STRUCTURES FOR IMPROVED VOLTAGE CHARACTERISTICS

Filed July 14, 1965 2 Sheets-Sheet 1

United States Patent Office 3,463,681

Patented Aug. 26, 1969

3,463,681
COATED MESA TRANSISTOR STRUCTURES FOR IMPROVED VOLTAGE CHARACTERISTICS

Gunter Winstel, Joachim Dathe, and Karl Heinz Zschauer, Munich, Germany, assignors to Siemens Aktiengesellschaft, Erlangen, Germany, a corporation of Germany Filed July 14, 1965, Ser. No. 471,831
Claims priority, application Germany, July 21, 1964, S 92,168
Int. Cl. H01l 7/44
U.S. Cl. 148—187 5 Claims

ABSTRACT OF THE DISCLOSURE

Described is a method of producing a semiconductor device with a mesa, and a pn junction extending perpendicularly to the mesa flanks and parallel to the planar mesa top. A mesa projection is first produced on the surface of a disc-shaped semiconductor crystal of one conductance type. An insulating protective layer comprised of an inorganic oxide is produced, at least at the flanks of the mesa, upon the surface of the semiconductor crystal. Only then is the final position of the pn junction adjusted in the mesa. The pn junction is produced in the peak of the mesa, through indiffusion of doping material which results in the opposite conductance type.

Our invention relates to semiconductor devices and the production of the same, and more particularly to the production of mesa or planar type devices, such as transistors, which have planar pn-junctions in parallel relation to the flat side of a wafer-like semiconductor crystal body.

There are known semiconductor devices, such as diodes or transistors, of the planar type in which the pn-junctions are diffused under originally formed oxide layers. Such devices exhibit particular advantages, since according to the present day developments in this field it is possible to coat a semiconductor crystal, for example a silicon crystal, with an accurately defined oxide layer, for example a layer of $SiO_2$. Hence the pn-junction of this type of planar structural element occurs on a surface, the properties of which are to a great extent definite. Planar transistors or diodes thus exhibit small blocking currents, a slight surface recombination and therewith a good linearity of current amplification, aside from a high degree of operational reliability and a long useful life. The current amplifying gain of devices of this type, even with the smallest collector currents, is very large and atomspheric influencies play only a relatively slight role even at higher temperatures.

However, it has been shown that in the case of planar devices of this type, the breakdown voltage exhibits values which lie considerably below what would be expected from the base material. Aside from other causes, such as surface phenomena and premature breakdown by so-called "pipes," the geometry of the pn-junction has a considerable influence on these values.

It is therefore a primary object of our invention to provide semiconductor devices of the planar type which exhibit excellent characteristics with respect to breakdown voltage, as well as exhibiting all of the desired characterists of known planar semiconductor devices.

Another object of our invention is to provide methods of producing semiconductor devices of this type.

Still another object of our invention is to devise semiconductor devices which exhibit the good properties of planar devices without entailing the disadvantages of inferior breakdown voltage which results from the curvature at the boundary of the pn-junction.

Other objects and advantages of our invention will be apparent from a further reading of the specification and of the appended claims.

With the above and other objects in view, our invention mainly comprises a semiconductor device comprising a semiconductor crystal wafer having a mesa on one flat side of the wafer and having in the mesa a diffusion-doped layer forming a planar pn-junction through the mesa in substantially parallel relation to the flat side of the wafer, an annular coating of inorganic oxide on this flat side of the wafer, this coating having an area portion parallel to the top of the mesa and surrounding the mesa and also having a portion disposed on and enclosing the perimetric surface of the mesa so as to enclose the planar pn-junction.

The invention, as well as other objects and advantages thereof will be best understood from the further description which follows, which description should be read in conjunction with the accompanying drawings, in which.

Figures 1, 2, 3, 4, 5, 6, 7, 8, 9:
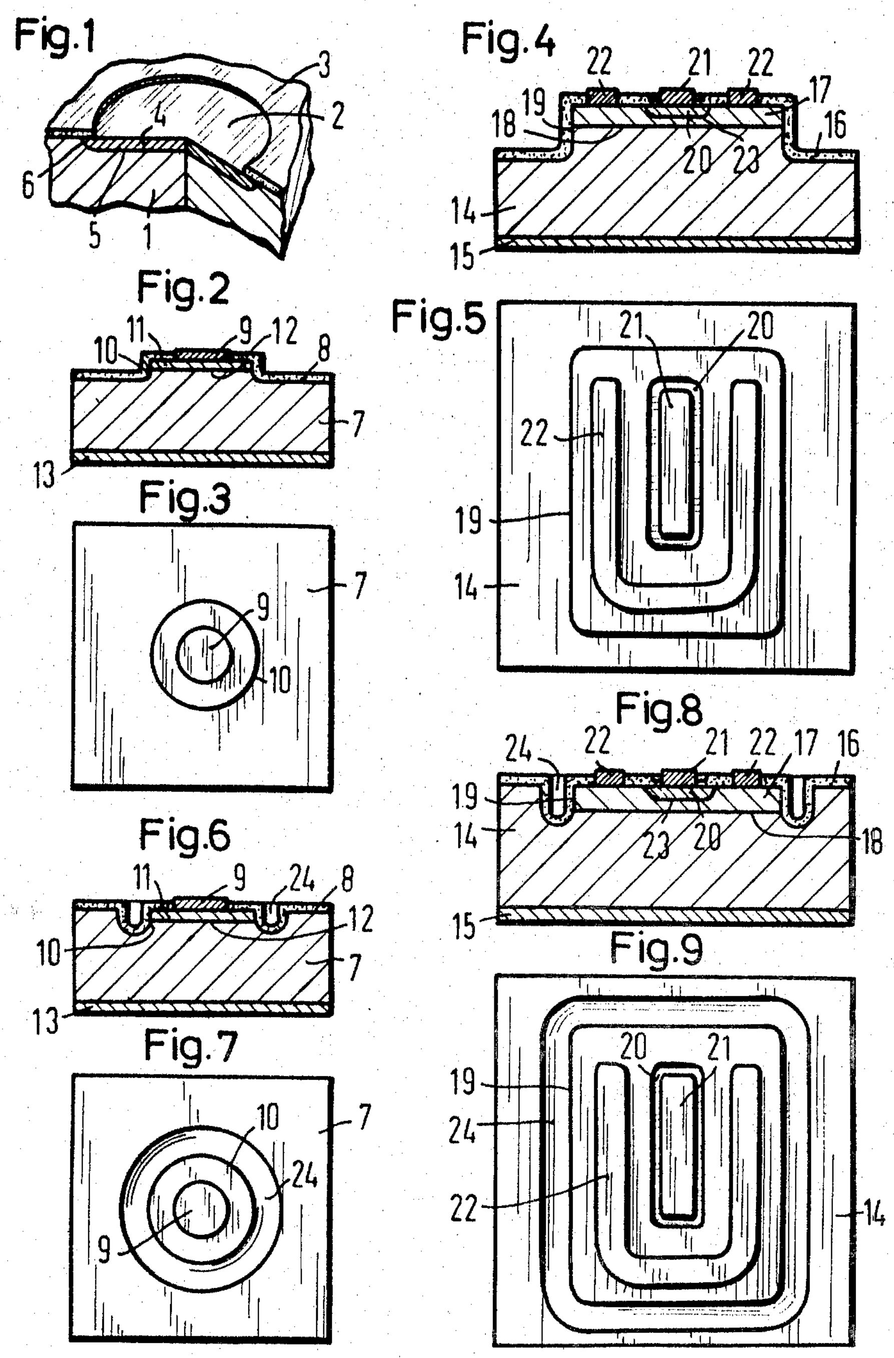
FIG. 1 is a section of a planar diode of known type.
FIG. 2 is a section of a semiconductor diode of our invention.
FIG. 3 is a plan view of the diode of FIG. 2.
FIG. 4 is a cross-sectional view of transistor of our invention.
FIG. 5 is a plan view of the transistor of FIG. 4.
FIG. 6 is a cross-sectional view of another diode prepared in accordance with our invention.
FIG. 7 is a plan view of the diode of FIG. 6.
FIG. 8 is a cross-sectional view of another transistor prepared in accordance with our invention.
FIG. 9 is a plan view of the transistor of FIG. 8.

In FIG. 1, the actual semiconductor body 1, consisting, for example, of silicon, is covered by a coating 3 of silicon dioxide in which an opening 2 is produced in the manner known in the planar technique. The doping substance for producing a pn-junction is indiffused through the opening. As a result of the diffusion there exists, as compared to the original semiconductor body 1, an opposingly doped region 4 and the pn-junction 5. The depth of penetration of region 4 into the original semiconductor is designated by $r_0$. As is shown in FIG. 1, the pn-junction 5 does not extend across the entire surface, but has a peripheral or boundary zone 6 which exhibits a specific curvature depending upon the depth of penetration $r_0$. Due to its changed field distribution this marginal zone exhibits a different breakdown voltage than does the rest of the portion.

Because of this curvature of the boundary zone of the pn-junction, which occurs in the devices produced according to the known planar technique, the mesa technique affords obtaining satisfactory breakdown voltages only by providing a considerable depth of diffusion. For many devices, such as transistors, with a very small base thickness, and highly insulated diodes, for example varactor diodes of high conductivity and also photodiodes, it is necessary to have only a small depth of diffusion. Another consideration is the fact that the greater depth of penetration of the diffusion layer also considerably increases the time or temperature required for the diffusion process.

It is not possible to obtain a higher breakdown voltage by using a starting material of higher specific (ohmic) resistance, because this considerably increases the path resistance.

Devices which do not have the pn-junction with the curvature at the boundary, for example the known mesa devices, however, are not suitable for many purposes because they exhibit high leakage currents and a high surface sensitivity.

Accordingly, our invention further provides semiconductor devices which exhibit the good properties of planar devices without exhibiting the disadvantage of curvature of the pn-junction boundary which results in a low breakdown voltage.

According to our invention a semiconductor device is provided, particularly transistors, in which a semiconductor crystal, preferably one of silicon, has a mesa on a flat side of the wafer and has in the mesa a diffusion-doped layer which forms a planar pn-junction through the mesa in substantially parallel relation to the wafer flat side. There is further provided an annular coating of inorganic oxide, preferably the oxide of the semiconductor material, on the flat side of the wafer, this coating having an area portion parallel to the top of the mesa and surrounding the mesa, and also having a portion disposed on and enclosing the perimetric surface of the mesa, which thus envelopes the planar pn-junction.

Thus, our invention provides a semiconductor mesa device in which the pn-junction is flat and parallel to the mesa top, and at least in the portion parallel to the top of the mesa there is provided an annular protective layer which surrounds the sides of the mesa top. This protective layer consists of an inorganic oxide, preferably an oxide of the semiconductor material. The flat pn-junction formed by diffusion, which within the mesa runs parallel to the top of the mesa, also lies within the closed annular layer of oxide. The devices of our invention have a pn-junction on a surface which is covered with an oxide layer whose properties are to a great extent definite, whereby the pn-junction is flat throughout, which is not the case in planar devices which have the above discussed marginal curvature.

According to a preferred embodiment of our invention, all sides of the oxide layer boundary of the flat pn-junction are formed within the annular closed oxide layer of the mesa. The formation, or at least the introduction, of the final layer of the pn-junction within the annular oxide layer of the mesa is accomplished when this portion of the mesa is already surrounded by the oxide layer.

According to a further embodiment of our invention, the annular protective layer surrounding the layer around the top of the mesa is at least as high as the charging zone developed around the planar pn-junction when the rated operating voltage is applied. This is primarily for obtaining a low capacity of the device, particularly a low collector capacity transistor.

It is further advantageous to partially cover the top of the mesa with a protective layer which lies above the flat pn-junction and to provide a preferably alloyed metal contact in its boundary zone in a window-like opening in the oxide layer. In this manner there is also provided a protection of this surface portion from other influences and simultaneously there is obtained a masking of the metal contact. By providing a contact on the opposite side of the mesa to the semiconductor crystal, a semiconductor diode is obtained.

According to another embodiment of our invention, the one of the two boundary zones of the flat pn-junction which is more highly doped is the one which is on the opposite side of the pn-junction in the tabletop of the mesa. This is particularly important when the used mesa top forms a pn-junction limiting zone of the base zone of the transistor so as to in this manner obtain particularly low impedance devices.

The invention further provides a transistor which on the flat pn-junction of the base zone and the collector zone of the transistor is masked off from the base zone of the tabletop of the mesa on which the opposite side of the flat pn-junction lies and is more highly doped than the collector zone.

According to a particularly advantageous embodiment of our invention, a transistor is provided in which between the flat pn-junction and the tabletop of the mesa an additional pn-junction is formed. This additional pn-junction is bounded by the oxide layer formed on the tabletop of the mesa. It is advantageous according to this embodiment to provide a window-like opening in the oxide layer formed on the top of the mesa and to contact the mesa top through said window using an alloyed metal contact. In this transistor, the upper part of the flat pn-junction lies in the mesa and acts as base zone. A second pn-junction is formed on the upper part of the first pn-junction. The second pn-junction acts as an emitter zone. The emitter zone is doped through the base zone.

According to a particularly preferred embodiment of our invention, the emitter zone is bounded, as a result of diffusion in of the doping substance through the flat pn-junction and between this flat pn-junction and the mesa top formed zone and thereby on its surface until deterioration.

The devices of our invention, particularly for obtaining a necessary high limiting frequency of the mesa top can also be obtained by etching of grooves in the flat side of the mesa top of the somewhat wafer-like semiconductor crystal.

In the example shown in FIGS. 2 and 3, a diode is shown consisting of a semiconductor crystal 7 of silicon, which has the shape of a wafer. In the n-conducting semiconductor body, which is doped with antimony, there is provided a p-conducting layer 11 of, for example boron, by diffusion. The pn-junction 12 lies within the table top of the mesa 10 and runs parallel to the mesa top. The mesa top and the boundary surface portion of the disc are coated with a layer of an inorganic oxide 8, for example a silicon dioxide layer. This oxide layer 8 is provided in the middle of the tabletop of the mesa with a window-like opening whose shape corresponds to the shape of the desired contact which is to be introduced therein, for example in fluted form or in the form of a ring. The layer 11 is contacted through this opening. A metal contact 9 serves for the contacting, in this example the metal contact consisting of aluminum. The side of the semiconductor body which is opposite the tabletop of the meta is provided with a metal contact 13, which for example consists of Au-Sb, and this metal is alloyed onto the semiconductor body. The metal contact 13 acts as the second electrode of the diode.

The following measurements and dopant concentrations are used for this example. The silicon disc is square with the length of the sides being 700 $\mu$m. and the diameter through the middle of the tabletop of the mesa being 200 $\mu$m. The mesa is 35 $\mu$m. high and the depth of penetration of the diffused layer 11 is 5 $\mu$m. The silicon dioxide layer is 0.5 $\mu$m. thick. The dopant concentration in the n-conducting zone 7 amounts to $N \approx 5.10^{14}$cm.$^{-3}$, and in the p-conducting zone $N \approx 10^{19}$cm.$^{-3}$.

With the depth of penetration of 5 $\mu$m. of the zone 11, the breakdown voltage amounts to about 400 v., while with a normal planar arrangement and a depth of penetration of 5 $\mu$m., the breakdown voltage only amounts to 200 v.

FIGS. 4 and 5 show a particularly advantageous embodiment of a transistor of our invention. The wafer-like semiconductor crystal 14 consists of n-conducting silicon. It is provided with a mesa 19. Parallel to the mesa top is a pn-junction 18, which in this case is formed from the base-collector-junction and is obtained by diffusion. The base zone of the transistor which is doped with boron is designated by numeral 17. The tabletop of the mesa as well as the boundary of the surface portion of the wafer are covered with an oxide layer, for example a layer of silicon dioxide 16. This layer is provided with a U-shaped opening, the bottom of which extends into the underlying surface of the semiconductor, and is there provided with a metal contact, for example an aluminum contact 22, which is alloyed at the bottom of the base layer. The U-shaped base contact 22 partially envelopes the emitter contact 21, as is clear from FIG. 5. Through the opening in the oxide layer, which is provided in the desired shape in the emitter, the emitter dopant is diffused, in this example the substance is phosphorus, which is provided with a channel-like contact 21 made out of aluminum. On the side opposite to the tabletop of the semiconductor crystal is the collector electrode 15, which is applied by alloying of Au-Sb onto the crystal.

The following gives the geometric measurements and several values for the dopant concentrations of the transistor of this example. The measurements of the square semiconductor crystal 14 are: 700 x 700 $\mu$m., the tabletop of the mesa has a width of 220 $\mu$m. and a length of 300 $\mu$m. The depth of penetration of the collector-pn-junction 18 is 3 $\mu$m. and of the emitter-pn-junction 23 is 2 $\mu$m. The mesa is 20 $\mu$m. high. The dopant concentration for the n-conducting collector zone is $10^{15}$cm.$^{-3}$, which corresponds to about 5 ohm cm., for the base zone is $10^{18}$cm.$^{-3}$, and for the emitter zone is $10^{21}$cm.$^{-3}$.

FIGS. 6–9 show other specific examples of a diode and transistor of our invention; in these examples the mesa is surrounded by an annular groove 24.

Instead of silicon, it is of course possible to use other semiconductor materials such as germanium, or even to use semiconductor compounds.

Figures 10, 11:
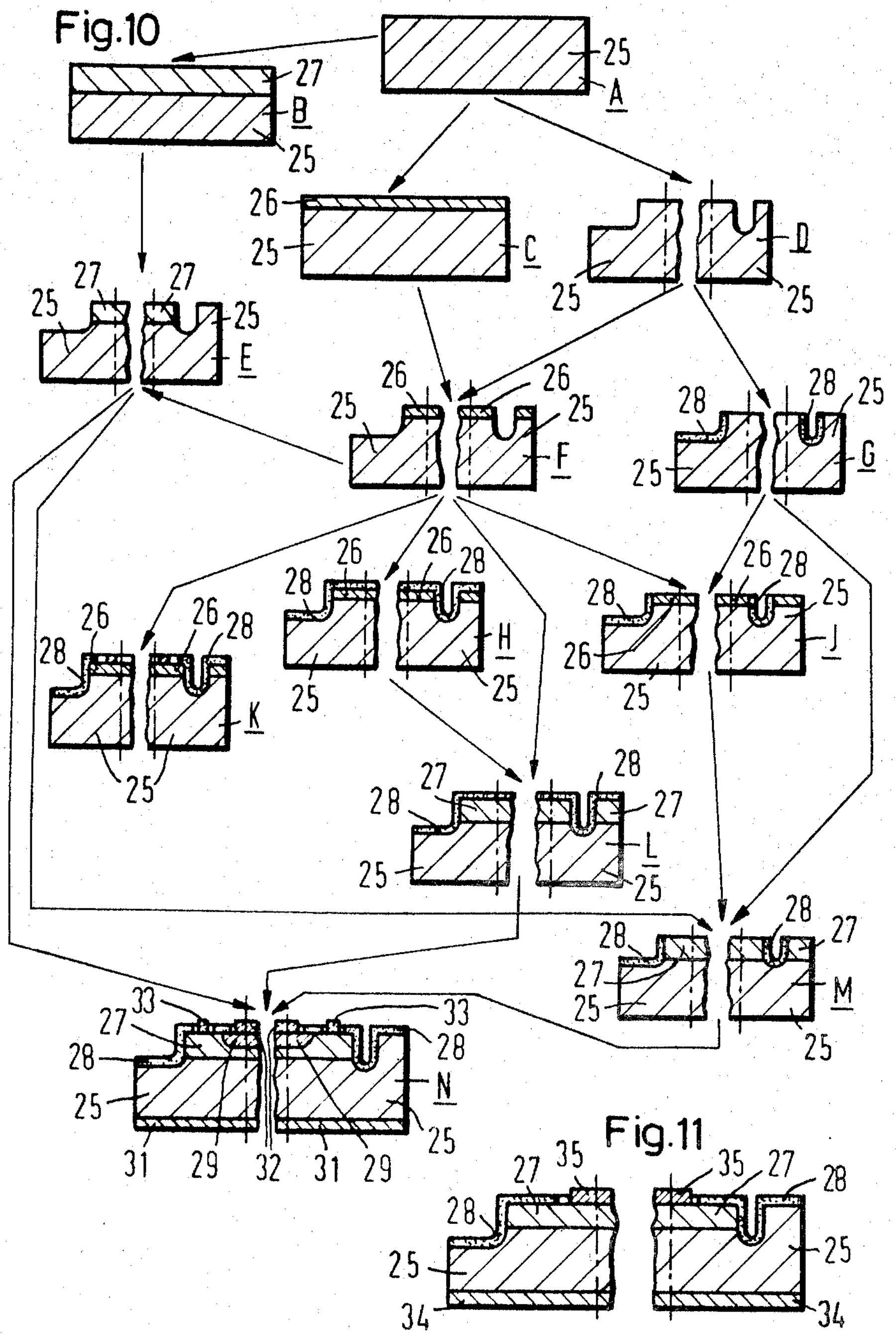
FIG. 10 is a schematic illustration showing the production of semiconductor devices in accordance with the method of our invention.
FIG. 11 is a schematic depiction of another diode that can be produced according to the method illustrated in FIG. 10.

The following examples of the method of producing semiconductor devices of our invention should be read in conjunction with FIG. 10. In the production it should be borne in mind that the same method steps apply for the production of semiconductor devices corresponding to FIGS. 2–5 as well as to other semiconductor devices corresponding to FIGS. 6–9 in which the mesa tabletop is obtained by etching a groove. In FIG. 10, the n-conducting semiconductor material is designated by the numeral 25, a subsequent p+ layer designating the highly doped layer with numeral 26, the layer produced by diffusion is designated by numeral 27, and the oxide layer is designated with the numeral 28.

There is first described three separate satisfactory methods of producing the semiconductor devices of our invention.

All of the methods start with an n-type semiconductor material, which in FIG. 10 is designated by A. According to a first method, the mesa is first produced by etching. This results in the structure designated by D. The oxidation layer is then applied. This must be done at least on the sides of the tabletop of the mesa in order to be certain that at the places at which the pn-junction is on the surface, it is covered with an oxide layer, and also in order to make certain that the oxide layer extends as far into the sides of the mesa top as the charging zone formed at the planar pn-junction when the rated operating voltage is applied. It is also possible that the entire surface of the semiconductor body, or at least the entire surface of the mesa, have an oxide layer applied thereto. The oxide layer is removed from the flat portion of the mesa. This can be accomplished by mechanical polishing or chemical etching commonly used for removing coatings.

In all cases the article G is produced. It is on this article that the flat pn-junction is formed in the portion of the mesa surrounded by the oxide layer by diffusion in of a dopant from the top of the mesa out in the direction of the wafer-shaped portion of the semiconductor material. There is then formed a flat pn-junction, as shown in M by arbitrary penetration under the protection of the oxide layer.

Already during the diffusion process there is on the top of the mesa which was previously freed of the oxide layer a thin oxide layer which can then be thickened by a further step. This oxidation layer is then, as shown in M provided with an opening in which the corresponding metal contact is introduced.

The schema shown in FIG. 10 produces as its end product a transistor with an emitter zone 29, an emitter contact 32, a base contact 33 and a collector contact 31. It is of course also possible to produce other devices by the described method, for example the diode shown in FIG. 11. Any desired diffusion profile can be obtained by this process.

According to a second method of proceeding, which constitutes a particularly preferred embodiment of the method of our invention, there is provided on a flat side of a doped wafer-like semiconductor crystal, an additional layer which is doped to an extent greater than that of the semi-conductor material, even up to degeneracy. This applied layer has a conductivity which is opposite to the conductivity of the semiconductor crystal. Then on this flat side of the crystal, by way of deposition, particularly etching, which forms mesas, there is formed the flat pn-junction, the dopant for the highly doped layer is applied by diffusion from the top of the mesa down into the interior of the mesa. On the semiconductor wafer there is thus obtained a very flat coating of only slight depth of penetration, but of high concentration (p+ layer). This can be obtained by diffusion. A thus treated semiconductor wafer is shown in C. The formation of the mesa on the wafer is then accomplished, for example, by etching. There is thus obtained a body which is shown in F. After the mesa is formed, the mesa is covered with an oxide protection layer, and only then is the dopant diffused into the highly doped layer in a portion of the mesa to form the flat pn-junction terminating at the protective oxide layer. The oxidation is then achieved under conditions by which the layer between the p+ layer and the n-conducting semiconductor crystal pn-junction is only very slightly changed. The resulting product is shown in H.

It has been found that then on the surface, preferably at the pn-junction, imperfections are obtained which favorably influence the electrical properties. Consequently, by a subsequent diffusion to the desired depth of penetration, the pn-junction in a region which does not contain the imperfections is displaced to the correspondingly produced semiconductor body shown under L. By this method, there is obtained a minimizing of the surface concentration without considerable diminution of the depth of penetration.

It is then possible to etch windows or openings in the oxide layer by photolithographic methods and to subsequently subject the same to emitter diffusion. Moreover, the contacting of the base zone and the emitter zone by means of metal contacts can follow. After introduction of the metal contacts there is obtained a transistor as shown in M.

According to a third method of proceeding, the conditions of applying the oxide layer, or the oxidation conditions for the oxidation of the surface are so chosen that a displacement of the pn-junction is simultaneously obtained to the desired depth of penetration. This method has additional limitations with respect to the depth of penetration, however, it can be carried out in the simplest technological manner.

According to still another embodiment of the method of the invention the mesa is first formed on a flat side of a doped wafer-like semiconductor material, by eroding, particularly by etching, after which a doped layer which is considerably more highly doped than the semiconductor material, even up to degeneracy is applied on the head of the mesa, this applied layer having a conductivity which is opposite that of the conductivity of the semiconductor material, and then to form the flat pn-junction, the dopant of the highly doped layer is applied by diffusion from the top of the mesa down into the interior of the mesa.

Starting from a semiconductor body after forming the mesa under D, a highly doped layer ($p^+$ layer) is applied to the mesa so that a semiconductor corresponding to the semiconductor body F is obtained. There is then obtained, either by applying the oxide layer or by oxidation of the surface under suitable conditions so that the layer of the pn-junction is not considerably changed, the body shown in H, which can then be converted to the transistor shown in N by the second method described above, or which can by suitably applied oxidation conditions or application of an oxide layer have the pn-junction simultaneously displaced up to the desired depth of penetration.

By the third method described above the semiconductor body shown in L is obtained from the semiconductor body F and from L the transistor N is obtained.

According to still another embodiment of our invention it is possible to proceed by first producing the semiconductor body F, applying an oxide layer in one of the manners previously described, so that the layer of the pn-junction is practically unchanged, and then removing the oxide layer from the top of the mesa, or by corresponding coating conditions during the forming of the oxide layer, formation thereof on the head of the mesa is prevented. There is thus obtained the semiconductor body shown in J, which by corresponding heat treatment is converted to the body M which exhibits the pn-junction penetrated to the desired depth of penetration. From the semiconductor body M it is then possible to produce the transistor N by the method and conditions described in the first method above.

It is also possible to proceed by the first method described above from the semiconductor body G to form the semiconductor body J, for example by diffusion of a corresponding dopant, the body J having a highly doped layer.

If we proceed in one of the already described manners to produce the semiconductor body F, the oxide layer can be applied by a masking procedure, whereby the window or opening for the emitter diffusion and the emitter and base contacts remains open. If then the oxidation conditions are so adjusted that no considerable displacement of the pn-junction occurs, the resulting semiconductor body is the one shown in K. It is then possible by a corresponding heat treatment to cause the diffusion to proceed until the desired depth of penetration. After diffusion in of the emitter zone and application of the corresponding contact in the already described manner, the transistor shown by M is obtained.

It should also be noted that it is also possible to obtain a pn-junction by diffusion starting from the semiconductor A to obtain the semiconductor body shown under B. The mesa is then formed by etching, so that the semiconductor body E is obtained. The oxide layer is then applied at least to the sides of the mesa. Then, by a subsequent diffusion treatment, which results in further displacement of the pn-junction into the inner part of the mesa, the semiconductor body is obtained which can then be converted into the transistor N in previously described manner.

It is also possible to provide the entire surface with a protective oxide layer, and then to provide this diffusion layer with the corresponding windows or openings for the emitter zone or the emitter contact and the base contact, and to produce transistor N therefrom in previously described manner.

Particularly good electrical properties can be obtained if the oxidation layer, in contrast to the last method described above, is applied either before or at least during the formation of the final pn-junction.

FIG. 11 shows a produced diode which can, for example, be the end product obtained by proceeding according to the method described in connection with FIG. 10. The portion N of the schema is then omitted. The numerals correspond to those in FIG. 10. The two diode contacts are designated with the numerals 34 and 35.

By the method described in connection with FIG. 10, it is possible to apply as the pn-junction-protecting oxide layer, particularly by evaporation, an inorganic oxide, preferably a silicon oxide, at least on the periphery of the flat pn-junction surface portions of the mesa, or according to a further embodiment of our invention, the protecting oxide layer of the mesa can be obtained by oxidation of the semiconductor material of the semiconductor crystal. The application of the oxide layer can be accomplished by pyrolysis or by anodic oxidation.

While the invention has been described in connection with the particular embodiments shown in the drawing and the particular examples described herein, it is apparent that modifications thereof can be made without, however, departing from the spirit or scope of the invention. Such modifications are consequently meant to be comprehended within the meaning and range of equivalents of the appended claims.

We claim:

1. Method of producing a semiconductor device with a mesa, and a pn-junction, extending perpendicularly through the mesa, in parallel to the planar top of the mesa, which comprises first producing a mesa-type protrusion on the surface of a disc-shaped p- or n-conducting semiconducting crystal, diffusing the doping material from the planar top of the mesa, toward the inside of the mesa and simultaneously producing an insulated oxide layer which covers the semiconductor crystal, at least at the flanks of the mesa, in such a manner that the pn-junction is shifted into its final position under the oxide layer which covers the flanks of the mesa.

2. The method of claim 1, wherein of the two regions of different conductance type, which are adjacent to the pn-junction extending perpendicular to the mesa, the region located on the top of the mesa is doped higer than the other region.

3. The method of claim 2, wherein the regions on both sides of the pn-junction, which extends perpendicular through the mesa, are respectively doped as a collector and as a base region, whereupon at the top of the mesa, an emitter region with a pn-junction is produced in such a way that the pn-junction of the emitter region is also coated by an oxide layer, covering also the mesa top.

4. The method of claim 3, wherein the mesa is surrounded by a groove on the surface of the remaining portion of the semiconductor body.

5. The method of claim 4, wherein the emitter region, formed through the indiffusion of doping material into the base region, adjacent to the planar pn-junction and located between said pn-junction and the dome of the mesa, is doped to degeneracy at its surface.

References Cited

UNITED STATES PATENTS

| | | | |
|---|---|---|---|
| 3,294,600 | 12/1966 | Yokota | 148—177 |
| 2,890,395 | 6/1959 | Lathrop et al. | 317—234 |
| 2,899,344 | 8/1959 | Atalla et al. | 148—1.5 |
| 2,930,722 | 3/1960 | Ligenza | 148—1.5 |
| 3,040,218 | 6/1962 | Byczkowski | 317—234 |
| 3,093,507 | 6/1963 | Lander et al. | 117—201 |
| 3,189,799 | 6/1965 | Moroney | 317—234 |
| 3,241,010 | 3/1966 | Eddleston | 317—234 |

JOHN W. HUCKERT, Primary Examiner

R. SANDLER, Assistant Examiner

U.S. Cl. X.R.

29—578; 317—235